US007589651B1

United States Patent
Shumarayev et al.

(10) Patent No.: US 7,589,651 B1
(45) Date of Patent: Sep. 15, 2009

(54) FLEXIBLE SIGNAL DETECT FOR PROGRAMMABLE LOGIC DEVICE SERIAL INTERFACE

(75) Inventors: Sergey Shumarayev, San Leandro, CA (US); Rakesh H. Patel, Cupertino, CA (US); Wilson Wong, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 12 days.

(21) Appl. No.: 11/467,332

(22) Filed: Aug. 25, 2006

(51) Int. Cl.
*H03M 1/00* (2006.01)
(52) U.S. Cl. .................. 341/132; 341/155; 341/174; 341/176; 326/37; 326/38; 326/39; 326/40; 326/41
(58) Field of Classification Search ........... 341/155, 341/156, 118, 120, 132, 141, 172, 174; 326/37–41
See application file for complete search history.

(56) References Cited

U.S. PATENT DOCUMENTS

| 4,115,847 | A | * | 9/1978 | Osder et al. ................. 700/4 |
| 4,933,676 | A | * | 6/1990 | Hauge et al. ................ 341/141 |
| 5,473,666 | A | * | 12/1995 | Szczebak et al. .............. 379/3 |
| 5,859,878 | A | * | 1/1999 | Phillips et al. ............... 375/316 |
| 6,184,713 | B1 | * | 2/2001 | Agrawal et al. ................ 326/41 |
| 6,185,263 | B1 | * | 2/2001 | Chan ........................... 375/295 |
| 6,230,255 | B1 | * | 5/2001 | Asghar et al. ................. 712/32 |
| 6,384,753 | B1 | * | 5/2002 | Brooks et al. ............... 341/118 |
| 6,753,772 | B2 | * | 6/2004 | Winkler ...................... 340/511 |
| 6,847,833 | B2 | * | 1/2005 | Chen ........................ 455/569.1 |
| 2002/0136316 | A1 | * | 9/2002 | Winkler ...................... 375/259 |
| 2005/0083222 | A1 | * | 4/2005 | Nickel et al. ................. 341/155 |
| 2005/0104751 | A1 | * | 5/2005 | Tsai et al. ..................... 341/34 |
| 2005/0288799 | A1 | * | 12/2005 | Brewer et al. ................. 700/1 |

* cited by examiner

*Primary Examiner*—Linh V Nguyen
(74) *Attorney, Agent, or Firm*—Ropes & Gray LLP; Jeffrey H. Ingerman

(57) ABSTRACT

A serial interface for a programmable logic device (PLD) uses an analog-to-digital converter (ADC) in place of conventional signal detect and receiver detect circuitry. A separate ADC can be used in each receiver and each transmitter in each serial interface on the PLD. Alternatively, time division multiplexing can be used to allow the receiver and transmitter in each receiver/transmitter pair, or even multiple receiver/transmitter pairs, to share a single ADC. When none of the receiver/transmitter pairs associated with a particular ADC is being used, the ADC can be accessed for use simply as an ADC.

26 Claims, 5 Drawing Sheets

FLEXIBLE SIGNAL DETECT FOR PROGRAMMABLE LOGIC DEVICE SERIAL INTERFACE

BACKGROUND OF THE INVENTION

This invention relates to signal detect circuitry for a high-speed serial interface, especially in a programmable logic device, and more particularly to signal detect circuitry having improved accuracy and flexibility.

PLDs frequently incorporate high-speed serial interfaces to accommodate high-speed (i.e., greater than 1 Gbps) serial I/O standards—e.g., the XAUI (10 Gbps Extended Attachment Unit Interface) standard. In accordance with the XAUI standard, a high-speed serial interface includes transceiver groups known as "quads," each of which includes four transceivers and some central logic.

Each transceiver typically includes signal detection circuitry in both its receiver and transceiver portions. In the receiver portion, the signal detection circuitry typically is referred to as "signal detect" or "SD," and generates a signal that alerts the rest of the receiver to incoming data. In the transmitter portion, the signal detection circuitry typically is referred to as "receiver detect" or "RxD," and generates a signal when it detects that transmitted signals are being received by a receiver at the other end. The same is true in serial transceivers other than those used with the XAUI standard.

Known signal detection circuits are analog, and typically incorporate a rectifier and an integrator, which produce a signal that is then compared to a reference level. However, the nature of rectification and integration is such that they cause a loss of accuracy.

Therefore, it would be desirable to be able to provide more accurate signal detection circuitry in serial interfaces, particularly on a programmable logic device.

SUMMARY OF THE INVENTION

The present invention provides more accurate signal detection circuitry in serial interfaces, particularly on a programmable logic device. In accordance with the invention, an analog-to-digital converter (ADC) is used as signal detect circuitry, both for receiver signal detect and for receiver detect in the transmit channel.

Signal detection of this type is typically a yes/no function, and therefore, while the detection threshold of the ADC may be programmable, the ADC output preferably is used "coarsely" to indicate that a signal has been detected. Thus, while the output of the ADC may be a full (e.g., 8-bit) digital word, the most significant bit alone might be used as the signal detect output. However, the full output of the ADC preferably remains available, and when the user logic design implemented in the programmable logic device does not use a particular serial interface, the ADC associated with that interface may be programmably connected, in accordance with the invention, to another portion of the programmable logic device.

In particular, when the ADC is not otherwise being used in a user logic design, the ADC output may be programmably connected in that user logic design either to an input/output (I/O) pin, or to another portion of the programmable logic device such as the programmable logic fabric. In other words, the user may choose to use an unused ADC as effectively a stand-alone ADC, with an analog signal input to one I/O pin and the digital output signal output to another I/O pin. Alternatively, the user may choose to process an analog input signal through the ADC and then route the resulting digital signal to the programmed logic of the programmable logic device for further processing.

ADCs are relatively large circuits, consuming substantial area on the programmable logic device. Accordingly, in accordance with another aspect of the invention, an ADC may be shared among several channels. First, the ADC may be shared between a transmitter and a receiver in the same transceiver channel. Second, the ADC may be shared across multiple transceiver channels. Preferably, sharing is accomplished by time-division multiplexing.

Thus, in accordance with the present invention, there is provided a serial interface for use in a programmable logic device. The serial interface preferably includes at least one of a transmitter and a receiver, an analog-to-digital converter in communication with an input/output pin of the programmable logic device, and selector circuitry for programmably connecting the analog-to-digital converter to one of the at least one transmitter and receiver, for use of the analog-to-digital converter as signal detect circuitry.

A programmable logic device incorporating such an interface is also provided.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention will now be described with reference to FIGS. 1-4.

Figure 1:
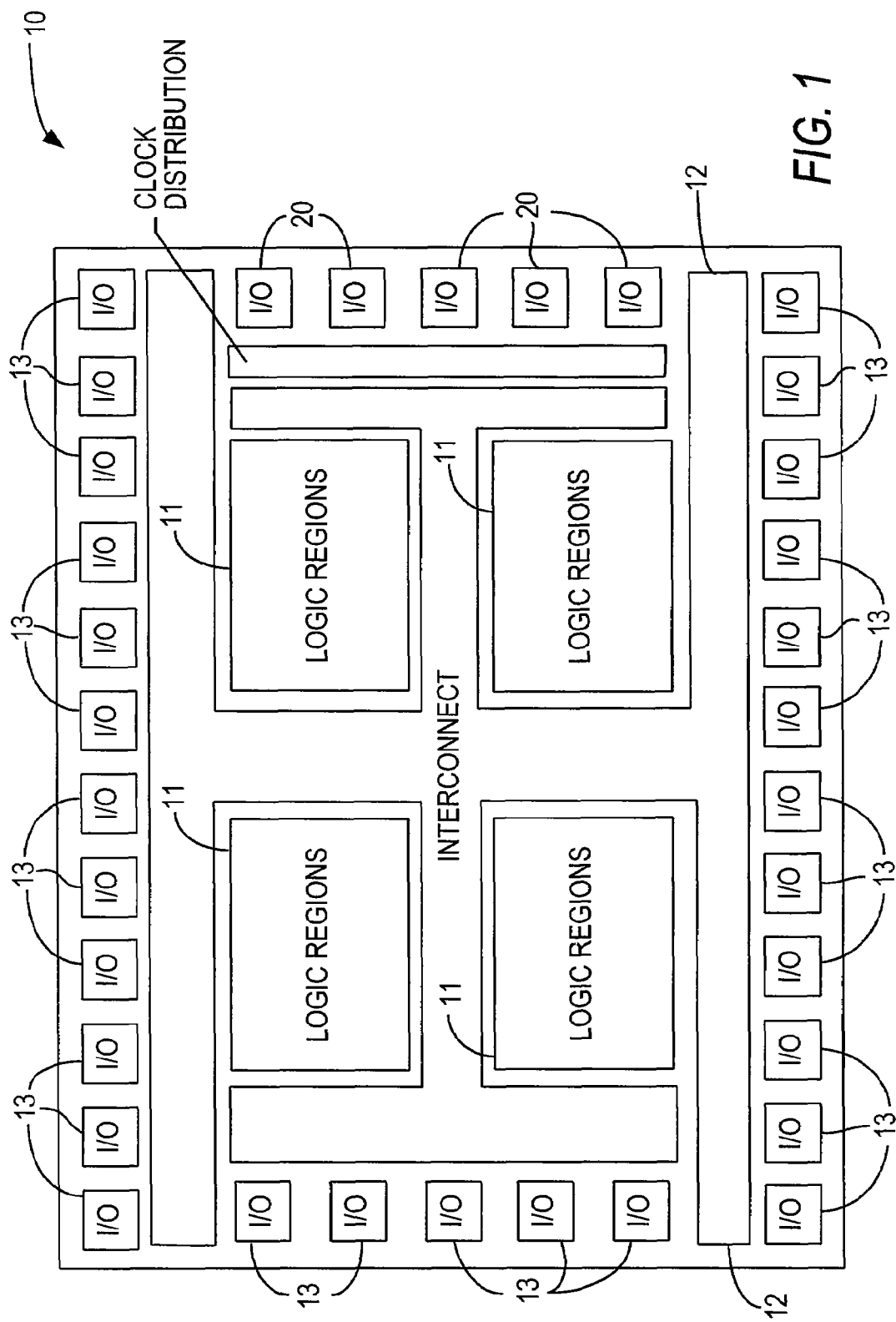
FIG. 1 is a block diagram of a preferred embodiment of a programmable logic device incorporating the present invention.

PLD 10, shown schematically in FIG. 1, is one example of a device incorporating a serial interface 20 according to the invention. PLD 10 has a programmable logic core including programmable logic regions 11 accessible to programmable interconnect structure 12. The layout of regions 11 and interconnect structure 12 as shown in FIG. 1 is intended to be schematic only, as many actual arrangements are known to, or may be created by, those of ordinary skill in the art.

PLD 10 also includes a plurality of other input/output ("I/O") regions 13. I/O regions 13 preferably are programmable, allowing the selection of one of a number of possible I/O signaling schemes, which may include differential and/or non-differential signaling schemes. Alternatively, I/O regions 13 may be fixed, each allowing only a particular signaling scheme. In some embodiments, a number of different types of fixed I/O regions 13 may be provided, so that while an individual region 13 does not allow a selection of signaling schemes, nevertheless PLD 10 as a whole does allow such a selection.

Figure 2:
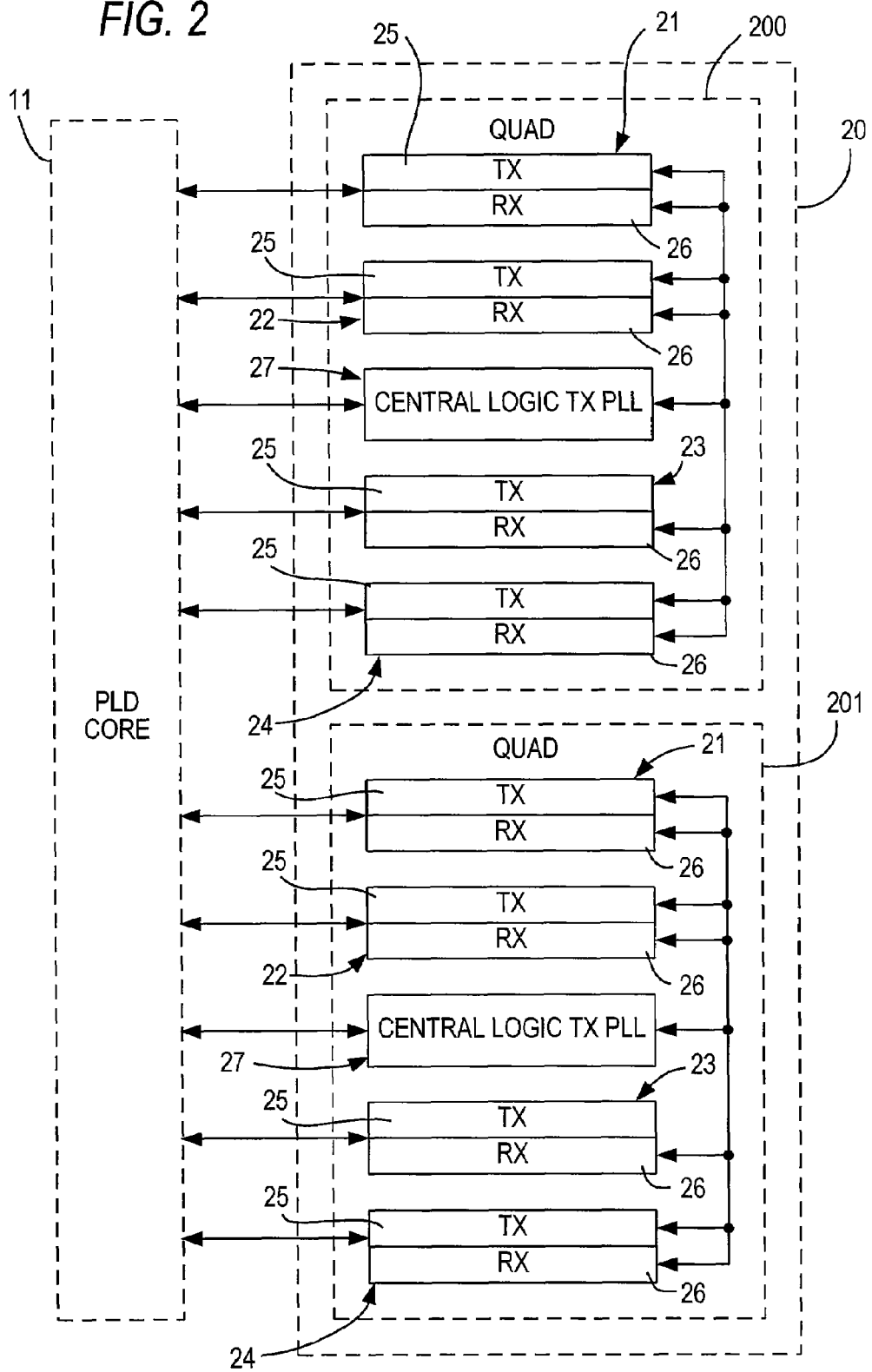
FIG. 2 is a schematic diagram of a first preferred embodiment of a serial interface incorporating the present invention.

For example, each I/O region 20 preferably is a high-speed serial interface as described above, similar to an interface capable of implementing the XAUI standard. Thus, as shown in FIG. 2, each interface 20 preferably includes one or more groupings 200, 201 having four channels 21-24, each including a transmitter 25 and a receiver 26, as well as central logic 27. As discussed above, because each such grouping includes four channels, it may be referred to as a "quad." However, it should be understood that in accordance with the present invention, which is not linked to any particular high-speed serial standard, each grouping 200, 201 can include any number of channels. Similarly, while each region 20 is shown to contain two groupings 200, 201, each region 20 may contain any number of groupings 200, 201.

As shown in FIG. 1, PLD 10 includes five interfaces 20. However, PLD 10 may include any desired number of interfaces 20, with a corresponding number of channels.

Within each interface 20, all transmitters 25 preferably are substantially identical, and all receivers 26 preferably are substantially identical, and preferably are substantially similar to known high-speed serial interface transmitters and receivers such as those used with the XAUI standard. One example of a suitable high-speed serial receiver is that shown in copending, commonly-assigned U.S. patent application Ser. No. 11/361,192, filed Feb. 23, 2006, which is hereby incorporated by reference herein in its entirety.

Figure 3:
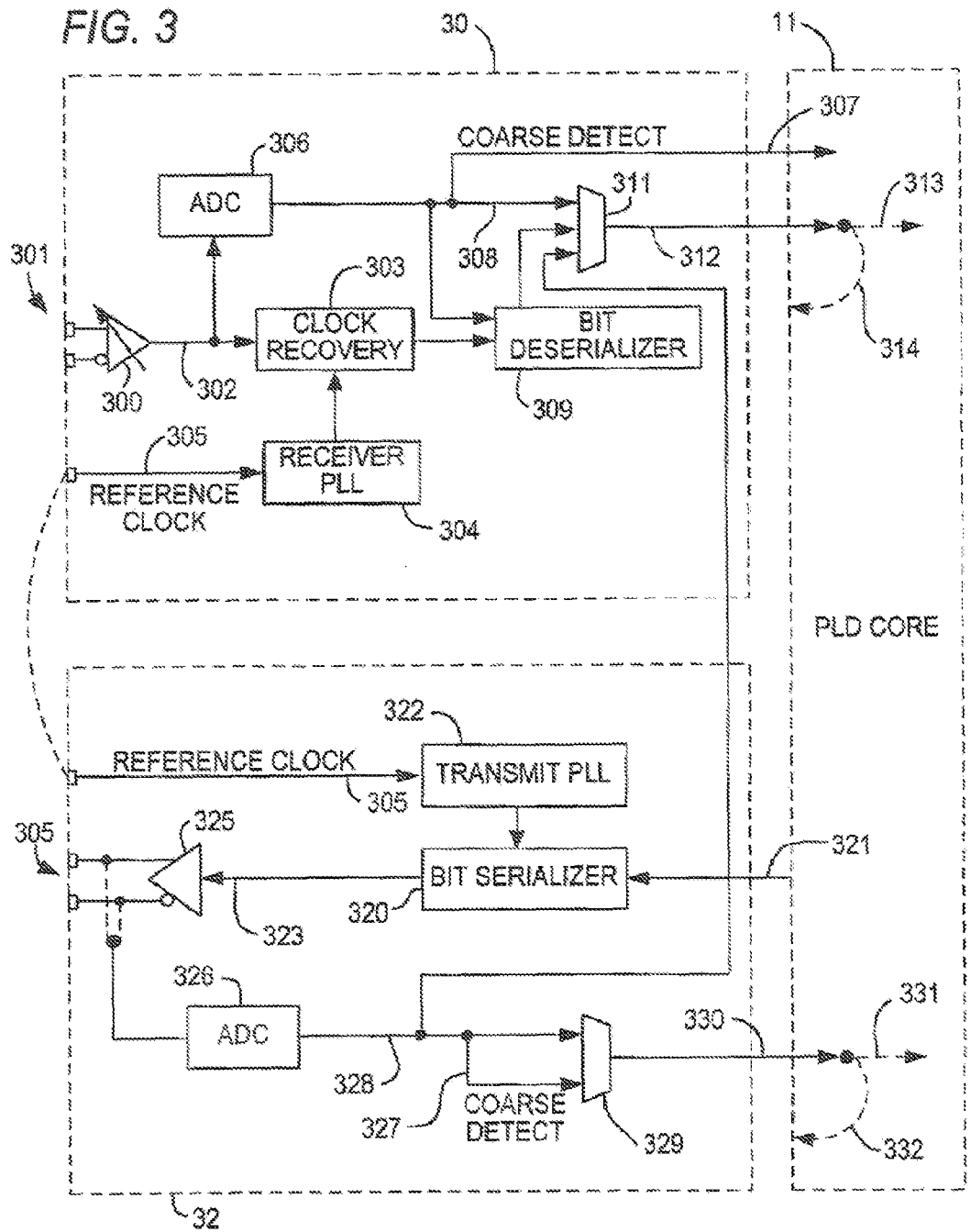
FIG. 3 is a schematic diagram showing detail of a portion of the serial interface of FIG. 2.

FIG. 3 shows schematically portions of both the receiver 30 and transmitter 32 of one of channels 21-24 of quad 200 in accordance with one preferred embodiment of the present invention. As seen in FIG. 3, receiver 30 preferably includes a buffer 300 for receiving the incoming serial data 301. Buffer 300 preferably has two inputs to accommodate differential signalling schemes (e.g., LVDS), but the particular signalling scheme forms no part of the present invention, which may be used with any differential or single-ended signalling scheme. Buffered data 302 preferably is input to clock recovery unit 303 which preferably is timed by receiver phase-locked loop (PLL) circuit 304, which preferably receives reference clock 305 preferably from outside receiver 30.

Buffered data 302 preferably also is input to ADC 306 which, in accordance with the present invention, preferably serves as a signal detect circuit. This allows accurate signal detection and fast response time. For example, there are ADCs that have 8-bit resolution and 1-2 gigasample-per-second sampling times. Because the transceiver speeds are generally even faster than the ADC sampling speed, input data 301 preferably are low-pass-filtered to remove frequencies above half the ADC sampling rate, to avoid aliasing. Preferably this is accomplished by buffer 300 which preferably includes low-pass filtering function, which preferably is variable.

Two outputs 307, 308 preferably are provided from ADC 306. Output 307, which may be referred to as a "coarse" output, preferably provides a simple yes/no-type signal similar to known signal detect circuitry, which simply indicates whether or not a signal is present. "Fine", output 308 preferably is the full digital output word of ADC 306. Coarse output 307 may be derived from fine output 308. For example, coarse output 307 may simply be the most significant bit of fine output 308.

Output 308 preferably is deserialized in deserializer 309, preferably using the clock recovered by clock recovery unit 303. Output 308 preferably also is provided to the programmable logic core or "fabric" 11 of PLD 10, to provide the digital equivalent of an analog signal that may be input at 301, using ADC 306 as an ADC. This feature may be used when receiver 30 is not being used as a receiver. Because receiver 30 is not being used, there is no reason to provide additional interconnect lines to conduct output 308 to logic core 11. Accordingly, multiplexer 311 preferably is provided to select either ADC fine output 308 (when receiver 30 is not being used) or the output 310 of deserializer 309 (when receiver 30 is being used) for conduction to core 11. Once multiplexer output 312 has been conducted to core 11, it may be used for logic operations in core 11 as indicated by arrow 313, or it may be conducted back to an output pin, as indicated by arrow 314. This allows a user to simply use ADC 306 as an ADC, converting an analog input on one pin to a digital output on another pin, when receiver 30 is not being used.

Transmitter 32 preferably includes a bit serializer 320 that preferably operates on data 321 from programmable logic core 11 and preferably is timed by transmit PLL circuit 322 which preferably receives reference clock 305 from outside transmitter 32. Preferably this is the same reference clock 305 used in receiver 30 Output 323 of serializer 320 preferably is output at 325 from PLD 10 preferably via buffer 324 which, like buffer 300, preferably can process both single-ended and differential outputs. ADC 326, preferably connected to output 325, preferably is used as a receiver detect circuit. Like ADC 306, ADC 326 preferably provides both a coarse output 327 and a fine output 328. Output 327 preferably provides a simple yes/no-type signal similar to known receiver detect circuitry, which simply indicates whether or not a signal is present. Fine output 328 preferably is the full digital output word of ADC 326. Coarse output 307 may be derived from fine output 328. For example, coarse output 327 may simply be the most significant bit of fine output 328.

Multiplexer 329 preferably is provided to select either ADC fine output 328 (when transmitter 32 is not being used) or the coarse (receiver detect) output 327 (when transmitter 32 is being used) for conduction to core 11. Once multiplexer output 330 has been conducted to core 11, it may be used for logic operations in core 11 as indicated by arrow 331, or it may be conducted back to an output pin, as indicated by arrow 332. This allows a user to simply use ADC 326 as an ADC, converting an analog input on one pin to a digital output on another pin, when transmitter 32 is not being used. Alternatively, because normally either (a) both receiver 30 and transmitter 32 will be used, or (b) neither receiver 30 nor transmitter 32 will be used, it is not necessary to have both multiplexers 311, 329. Instead, multiplexer 311 can be a 3:1 multiplexer as shown, and output 328 can be one of the selections of multiplexer 311. In such an alternative, multiplexer 329 can be omitted, with output 327 being conducted directly to core 11. However, when multiplexer 329 is present, multiplexer 311 need not be a 3:1 multiplexer, and can be a 2:1 multiplexer instead.

Figure 4:
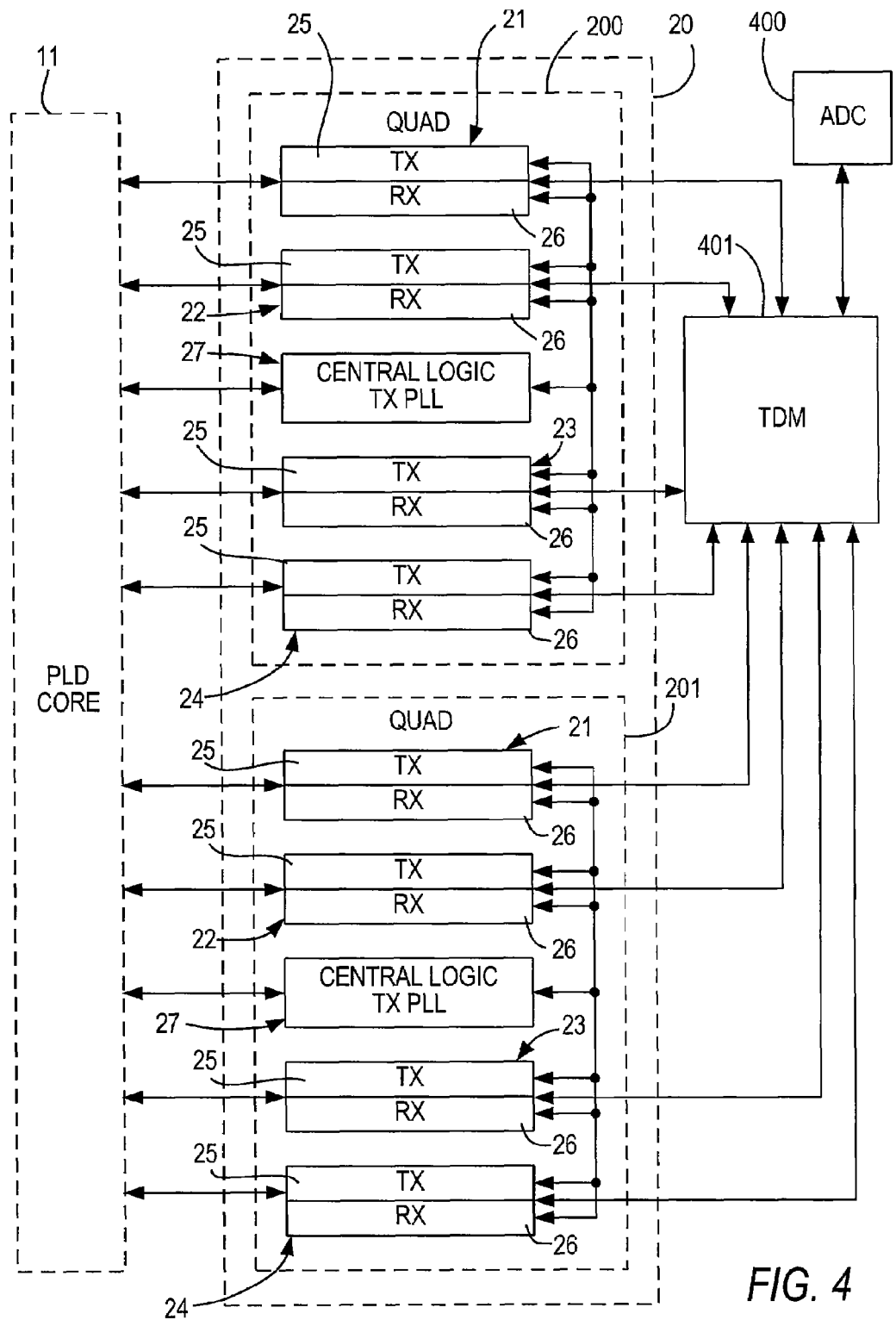
FIG. 4 is a schematic diagram of a second preferred embodiment of a serial interface incorporating the present invention.

Providing an individual ADC in each receiver and transmitter of serial interface 20 may be too costly (whether cost is expressed in terms of device area consumed or monetary cost) in some applications. Accordingly, a single ADC 400 can be shared within each receiver/transmitter pair 30, 32, using time division multiplexing (TDM) techniques. Or ADC 400 can be shared among all receiver/transmitter pairs 30, 32 within an interface 20, or even among receiver/transmitter pairs 30, 32 across several interfaces 20. FIG. 4 shows an arrangement in which ADC 400 is shared, using TDM circuitry 401, among all receiver/transmitter pairs 30, 32 within a single interface 20. However, the number of receiver/transmitter pairs 30, 32 that can share ADC 400 is limited only by the relative speeds of the data, ADC 400 and TDM circuitry 401. Preferably, when none of the receiver/transmitter pairs associated with ADC 400 are being used, ADC 400 can be made available, as above, for use as an ADC.

Figure 5:
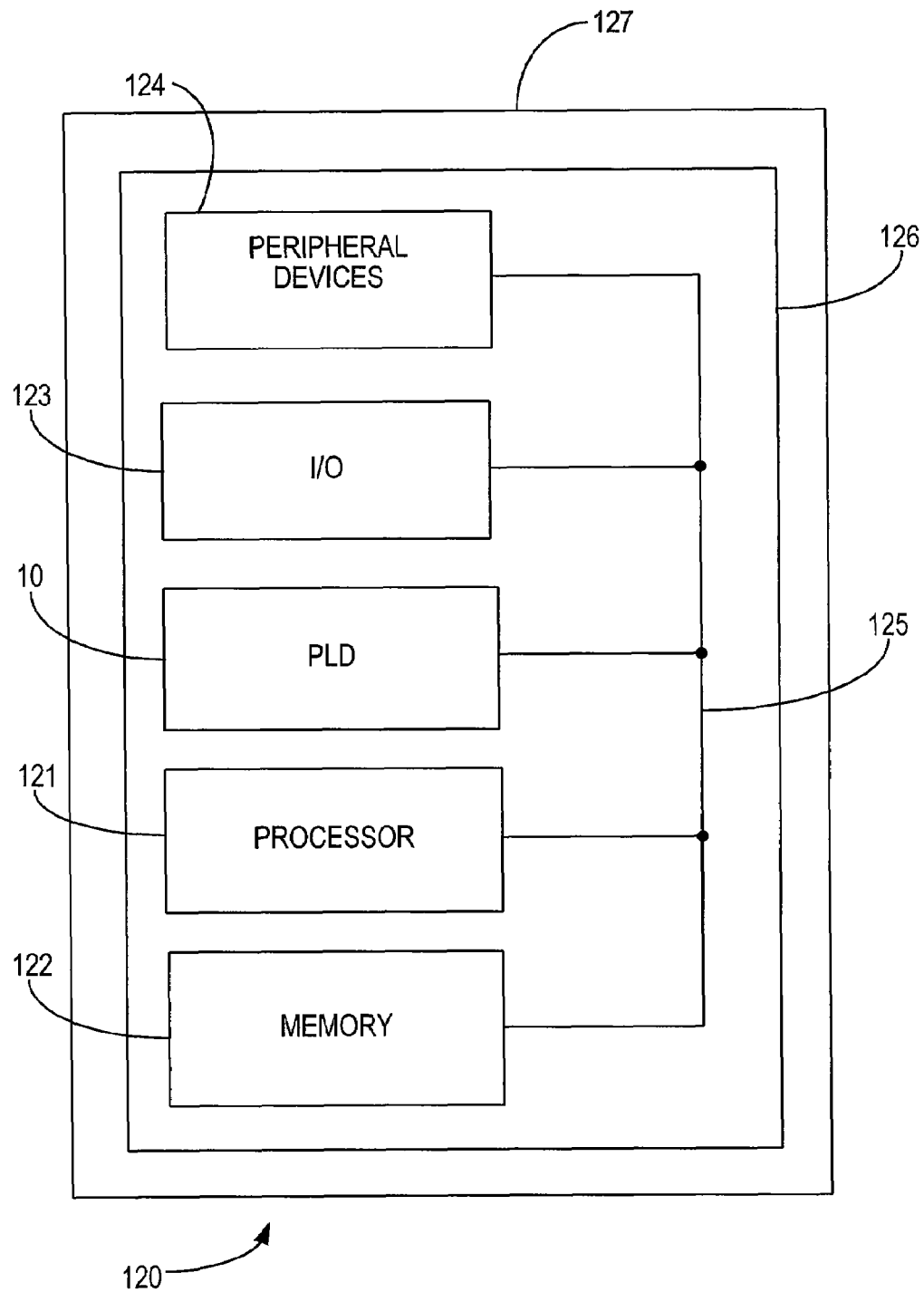
FIG. 5 is a simplified block diagram of an illustrative system employing a programmable logic device incorporating a serial interface in accordance with the present invention.

A PLD 10 incorporating interfaces 20 according to the present invention may be used in many kinds of electronic devices. One possible use is in a data processing system 120 shown in FIG. 5. Data processing system 120 may include one or more of the following components: a processor 121; memory 122; I/O circuitry 123; and peripheral devices 124. These components are coupled together by a system bus 125 and are populated on a circuit board 126 which is contained in an end-user system 127.

System 120 can be used in a wide variety of applications, such as computer networking, data networking, instrumentation, video processing, digital signal processing, or any other application where the advantage of using programmable or reprogrammable logic is desirable. PLD 10 can be used to perform a variety of different logic functions. For example, PLD 10 can be configured as a processor or controller that works in cooperation with processor 121. PLD 10 may also be used as an arbiter for arbitrating access to a shared resources in system 120. In yet another example, PLD 10 can be configured as an interface between processor 121 and one of the other components in system 120. It should be noted that system 120 is only exemplary, and that the true scope and spirit of the invention should be indicated by the following claims.

Various technologies can be used to implement PLDs 10 as described above and incorporating this invention. It will be understood that the foregoing is only illustrative of the principles of the invention, and that various modifications can be made by those skilled in the art without departing from the scope and spirit of the invention, and the present invention is limited only by the claims that follow.

What is claimed is:

1. A serial interface for use in a programmable logic device, said serial interface comprising:
   at least one of a transmitter and a receiver; and
   an analog-to-digital converter operable as signal detect circuitry to provide a signal detect signal to said at least one of a transmitter and a receiver, said signal detect signal alerting said at least one of a transmitter and a receiver that data signals are being received.

2. The serial interface of claim 1 further comprising selector circuitry for programmably connecting an output of said analog-to-digital converter to another portion of said programmable logic device for use as an analog-to-digital converter.

3. The serial interface of claim 2 wherein said selector circuitry comprises a multiplexer.

4. The serial interface of claim 2 wherein said another portion of said programmable logic device comprises an input/output pin of said programmable logic device.

5. The serial interface of claim 2 wherein said another portion of said programmable logic device comprises programmable logic of said programmable logic device.

6. The serial interface of claim 2 wherein said analog-to-digital converter operates in a coarse mode when used as signal detect circuitry and in a fine mode when used as an analog-to-digital converter.

7. The serial interface of claim 6 wherein:
   said analog-to-digital converter outputs a digital word;
   said fine mode comprises using all of said digital word; and
   said coarse mode comprises using less than all of said digital word.

8. The serial interface of claim 7 wherein said coarse mode comprises using only one bit of said digital word.

9. The serial interface of claim 8 wherein said one bit of said digital word comprises a most significant bit of said digital word.

10. The serial interface of claim 2 further comprising sharing circuitry for sharing said analog-to-digital converter among said transmitter and said receiver.

11. The serial interface of claim 10 wherein said sharing circuitry comprises time-division multiplexing circuitry.

12. The serial interface of claim 1 further comprising sharing circuitry for sharing said analog-to-digital converter between said transmitter and said receiver.

13. The serial interface of claim 12 wherein said sharing circuitry comprises time-division multiplexing circuitry.

14. A programmable logic device comprising:
    at least one serial interface; wherein:
    said serial interface comprises:
    at least one of a transmitter and a receiver, and
    an analog-to-digital converter operable as signal detect circuitry to provide a signal detect signal to said at least one of a transmitter and a receiver, said signal detect signal alerting said at least one of a transmitter and a receiver that data signals are being received.

15. The programmable logic device of claim 14 further comprising selector circuitry for programmably connecting an output of said analog-to-digital converter to another portion of said programmable logic device for use as an analog-to-digital converter.

16. The programmable logic device of claim 15 wherein said selector circuitry comprises a multiplexer.

17. The programmable logic device of claim 16 wherein said another portion of said programmable logic device comprises an input/output pin of said programmable logic device.

18. The programmable logic device of claim 16 wherein said another portion of said programmable logic device comprises programmable logic of said programmable logic device.

19. The programmable logic device of claim 16 wherein said analog-to-digital converter operates in a coarse mode when used as signal detect circuitry and in a fine mode when used as an analog-to-digital converter.

20. The programmable logic device of claim 19 wherein:
    said analog-to-digital converter outputs a digital word;
    said fine mode comprises using all of said digital word; and
    said coarse mode comprises using less than all of said digital word.

21. The programmable logic device of claim 20 wherein said coarse mode comprises using only one bit of said digital word.

22. The programmable logic device of claim 21 wherein said one bit of said digital word comprises a least significant bit of said digital word.

23. The programmable logic device of claim 14 wherein:
    said at least one serial interface comprises a plurality of serial interfaces; and
    said programmable logic device further comprises sharing circuitry for sharing said analog-to-digital converter among said plurality of serial interfaces.

24. The programmable logic device of claim 23 wherein said sharing circuitry comprises time-division multiplexing circuitry.

25. The programmable logic device of claim 14 wherein said programmable logic device further comprises sharing circuitry for sharing said analog-to-digital converter among said transmitter and said receiver.

26. The programmable logic device of claim 25 wherein said sharing circuitry comprises time-division multiplexing circuitry.

* * * * *